United States Patent [19]

Oda et al.

[11] Patent Number: 5,252,132
[45] Date of Patent: Oct. 12, 1993

[54] APPARATUS FOR PRODUCING SEMICONDUCTOR FILM

[75] Inventors: Masao Oda; Yoshiyuki Goto; Toyomi Osige; Tatsuya Iwasa; Yoshimi Kinoshita; Katsuhisa Kitano; Kazuo Yoshida, all of Amagasaki, Japan

[73] Assignee: Mitsubishi Denki Kabushiki Kaisha, Tokyo, Japan

[21] Appl. No.: 796,618

[22] Filed: Nov. 22, 1991

[30] Foreign Application Priority Data

Nov. 22, 1990 [JP] Japan .................. 2-123396[U]
May 7, 1991 [JP] Japan .................. 3-101082

[51] Int. Cl.⁵ .................................. C23C 16/00
[52] U.S. Cl. .................................. 118/725; 118/715; 118/728; 118/730
[58] Field of Search ............. 118/715, 725, 728, 729, 118/730

[56] References Cited

U.S. PATENT DOCUMENTS

| | | | |
|---|---|---|---|
| 4,796,562 | 1/1989 | Brors | 118/725 |
| 4,919,077 | 4/1990 | Oda et al. | 118/723 |
| 5,033,407 | 7/1991 | Mizuno | 118/725 |
| 5,063,031 | 11/1991 | Sato | 118/725 |
| 5,108,792 | 4/1992 | Anderson | 118/725 |

OTHER PUBLICATIONS

Lassig et al., "Kinetics of Rapid Thermal Oxidation of Silicon", Materials Research Society, vol. 92, 1987, pp. 103-109.
Blake et al., "Slip Free Rapid Thermal Processing", Materials Research Society, vol. 92, 1987, pp. 265-273.
Moslehi et al., "Microwave Plasma LPCVD of Tungsten in a Gold-Wall Lamp-Heated Thermal Processor", Materials Research Society, vol. 92, 1987, pp. 295-303.

Primary Examiner—Richard Bueker
Attorney, Agent, or Firm—Leydig, Voit & Mayer

[57] ABSTRACT

A semiconductor film production apparatus includes a reaction vessel for containing a substrate and including a gas supply port for supplying a reaction gas to the vessel, a gas discharge port for discharging the reaction gas from the vessel after reaction, and a light-transmitting glass window; a light source disposed outside the reaction vessel for irradiating a substrate in the reaction vessel through the light-transmitting glass window to heat the substrate; a cylindrical substrate holder disposed in the reaction vessel for holding the substrate with a first surface facing the light source and a second surface, opposed to the first surface, exposed to the reaction gas; a ring plate having a central opening with an area smaller than the substrate and an outside diameter dividing the reaction vessel into two compartments, the ring plate contacting the first surface of the substrate; a carrier gas supply port for introducing a carrier gas between the substrate and the light-transmitting glass window; and a reaction gas supply nozzle disposed in the substrate holder connected to said gas supply port and opposing the second surface of the substrate.

7 Claims, 10 Drawing Sheets

APPARATUS FOR PRODUCING SEMICONDUCTOR FILM

FIELD OF THE INVENTION

The present invention relates to an apparatus for producing a semiconductor film and, more particularly, to an apparatus for producing a semiconductor film on a substrate heated with light, the heated substrate decomposing a reaction gas.

BACKGROUND OF THE INVENTION

Figure 12:
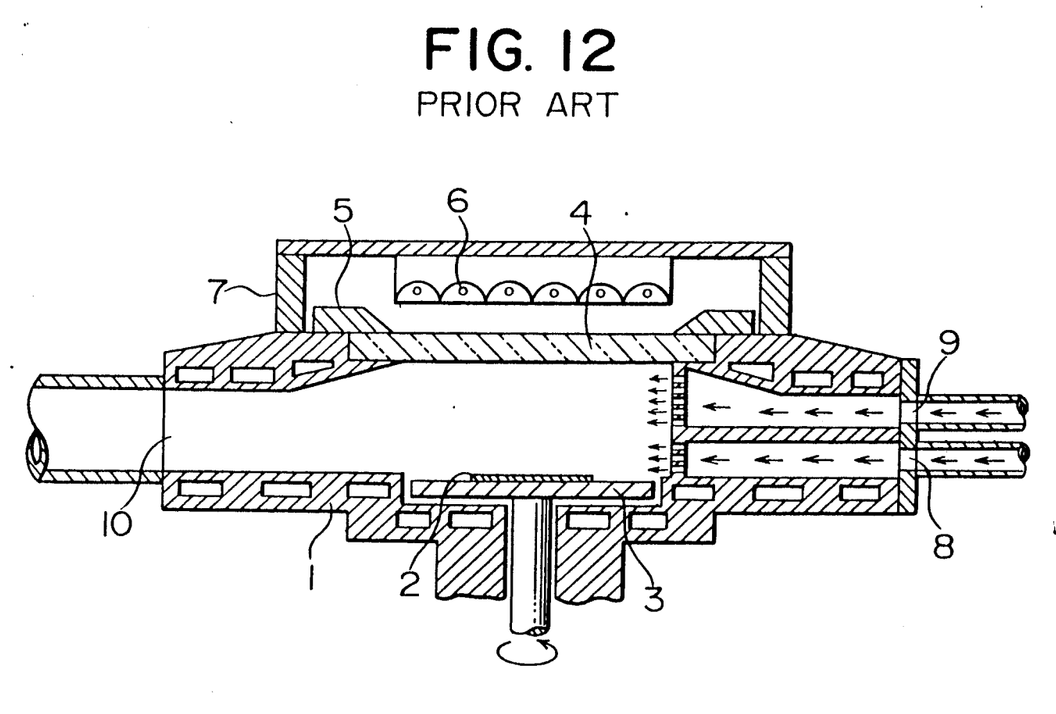
FIG. 12 is a schematic sectional view of another known semiconductor film production apparatus.

FIG. 12 shows in section, by way of example, a semiconductor production apparatus disclosed in Japanese Published Patent Application 61-279120. The apparatus has a reaction vessel 1 and a susceptor 3 which is rotatably disposed in a lower portion of the reaction vessel 1 for supporting a substrate 2, such as a silicon substrate. A light-transmitting glass window 4 is disposed in an upper wall of the reaction vessel 1 opposite the susceptor 3. A cover plate 5 is disposed around the light-transmitting glass window 4. A lamp housing 7 is disposed outside the light-transmitting glass window 4. A light source 6, such as an infrared lamp, is disposed inside the lamp housing 7 opposite the susceptor 3. A reaction gas mixture, e.g., a gas mixture containing silane, is introduced into the reaction vessel 1 through a reaction gas supply port 8. A carrier gas which does not contain any reaction gas is introduced into the reaction vessel 1 through a carrier gas supply port 9. The gas inside the reaction vessel 1 is discharged from a gas discharge port 10.

A substrate 2 is placed on the susceptor 3 and a rotary driving means (not shown) is activated to rotate the susceptor 3. The infrared lamp 6 irradiates the substrate 2 through the light-transmitting glass window 4, thereby heating the substrate 2. A reaction gas mixture is introduced into the reaction vessel through the reaction gas supply port 8 and the reaction gas flows parallel to the substrate 2 in the region near the substrate. At the same time, a carrier gas in introduced into the reaction vessel 1 through the carrier gas supply port and the carrier gas flows parallel to the substrate 2 in the region near the light-transmitting window 4.

The reaction gas mixture containing silane is thermally decomposed by the heat from the substrate 2 so that film precursor radicals are formed. The film precursor radicals reach the surface of the substrate 2 so that a silicon polycrystalline film is formed on the surface of the substrate 2. The surplus reaction gas and the carrier gas are discharged from the reaction vessel 1 through a discharge port 10.

In this known apparatus, the film precursor radicals are prevented from diffusing to the region near the light-transmitting glass window 4 because the carrier gas flows in the region near the light-transmitting glass window 4 so that deposition of the film precursor radicals on the light-transmitting glass window 4 is avoided. Therefore, prevention of diffusion of the radicals toward the light-transmitting glass window 4 at the downstream side is less effective than at the upstream side of the flow of the reaction and carrier gases. Consequently, deposition of the film precursor radicals on the light-transmitting glass window 4 cannot be perfectly avoided at the downstream side, particularly when the substrate 2 is large.

The deposition of the film precursor radicals on the light-transmitting glass window 4 undesirably impairs the light-transmitting characteristics of the glass window 4 and heating of the substrate 2, making it difficult to develop a uniform temperature distribution across the substrate, a critical parameter controlling the rate of formation of the film on the substrate 2. Furthermore, unnecessary reaction products tend to be trapped in the film at the surface of the substrate and impair the quality of the film.

Figure 13:
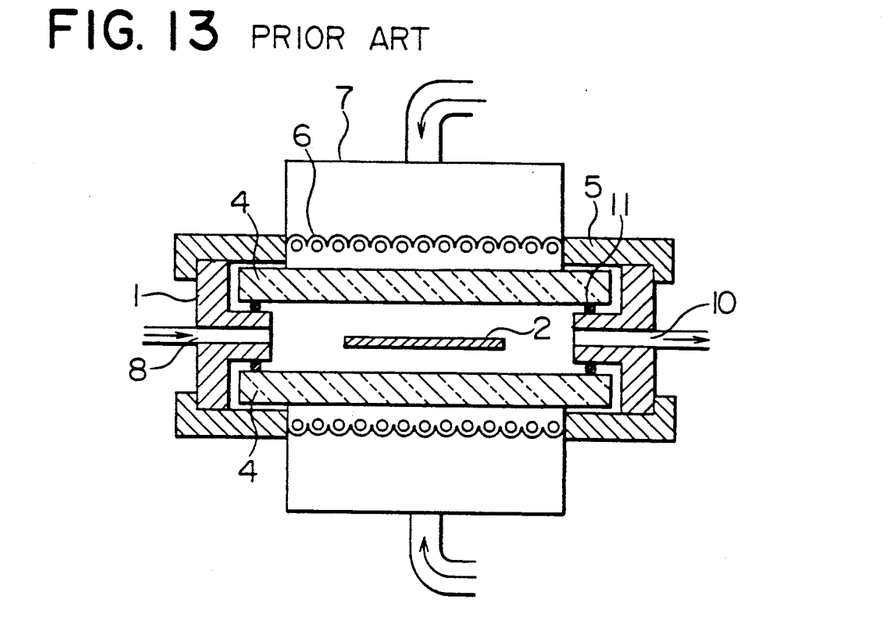
FIG. 13 is a schematic sectional view of still another known semiconductor film production apparatus.

In recent years, a so-called lamp heating method has been proposed in which a substrate can be heated in a short time by means of a lamp during production of a semiconductor film. A semiconductor film production apparatus employing the lamp heating method is disclosed in Mat. Res. Soc. Symp., Volume 46, page 57. FIG. 13 is a schematic sectional view of this apparatus. For the purpose of forming, for example, a thin silicon film on a silicon substrate 2, silane gas is introduced into a reaction vessel 1 through a gas supply port 8. In order to hermetically seal the gap between the reaction vessel 1 and the light-transmitting glass window 4, an "O" ring is interposed therebetween. The substrate 2 is heated with light transmitted from an infrared lamp 6 to the substrate through a light-transmitting window. The surface of the substrate 2 is heated to a high temperature as a result of absorption of the infrared light so that the silane gas is decomposed on the surface of the substrate 2, whereby a thin film of silicon is formed. After reaction, the gas is discharged from the reaction vessel through a gas discharge port 10.

In this known semiconductor production apparatus, part of the infrared light from the infrared lamp 6 passes through the light-transmitting glass window 4 and is absorbed by the "O" ring 11. Therefore, the temperature of the "O" ring 11 is raised to a level above its rated temperature so that the "O" ring is degraded and the reaction vessel seal fails. Consequently, problems are encountered, such as an inability to produce high-quality films due to mixing of air with the high-purity reaction gases and dangerous leakage of the reaction gas from the vessel 1 into the atmosphere.

Figure 14:
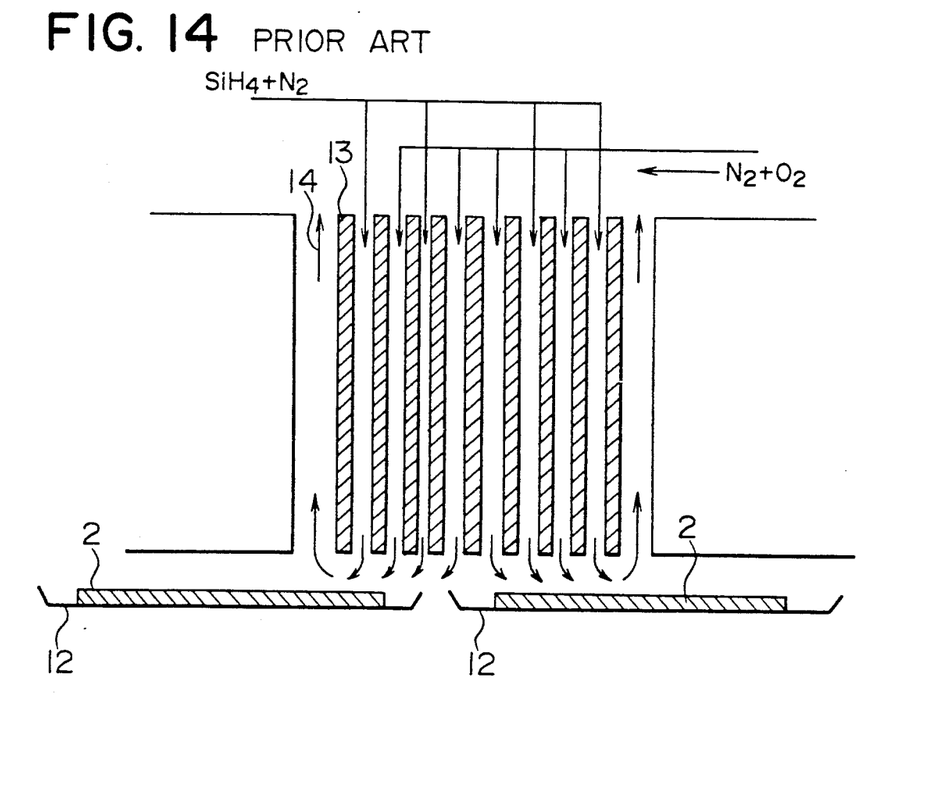
FIG. 14 is a schematic sectional view of still another known semiconductor film production apparatus.

FIG. 14 shows a known thin film forming apparatus, particularly an apparatus for forming a thin film in a CVD process, which is disclosed in the *Photo-Thin-Film Technology Manual*, published by Optronics Kabushiki Kaisha. In this apparatus, the substrate 2 is heated to a suitable temperature and, at the same time, SiH₄ carried by N₂ is introduced together with O₂ through a nozzle of a reaction gas supply portion 13 onto the substrate 2 and extracted from a discharging portion 14 whereby a silicon oxide film is formed on the substrate 2 through a chemical reaction. Difficulties in controlling the flow of the reaction gas, which adversely affects the uniformity of the film thickness of the deposited film, have been encountered with this apparatus.

SUMMARY OF THE INVENTION

Accordingly, an object of the present invention is to provide a semiconductor film production apparatus which prevents the deposition of film precursor radicals on a light-transmitting glass window while improving the uniformity of the temperature distribution on the substrate to produce a film of uniform thickness and quality over the entire area of a substrate, thereby overcoming the problems of the prior art explained in connection with FIG. 12.

Another object of the present invention is to provide a semiconductor production apparatus which prevents heating light from being absorbed by a sealing "O" ring to maintain the required sealing of the reaction vessel, thereby overcoming the problem of the prior art explained in connection with FIG. 13.

A further object of the present invention is to provide a thin film forming semiconductor production apparatus in which the flow of the reaction gas can be suitably controlled to eliminate the problem encountered by the prior art explained in connection with FIG. 14.

To these ends, according to one aspect of the present invention, there is provided a semiconductor film production apparatus comprising a reaction vessel for containing a substrate and including a gas supply port for supplying a reaction gas to the vessel, a gas discharge port for discharging the reaction gas from the vessel after reaction, and a light-transmitting glass window; light-irradiating means disposed outside the reaction vessel for irradiating a substrate in the reaction vessel with light through the light-transmitting glass window to heat the substrate; a cylindrical substrate holder disposed in the reaction vessel opposite the light-irradiating means for holding the substrate such that a first surface of the substrate on which a film is deposited in the apparatus faces the light-irradiation means; a ring plate having a central hollow with an area smaller than the area of the substrate and dividing the reaction vessel into two compartments, the ring plate contacting the first surface of the substrate; a carrier gas supply port for introducing a carrier gas into the reaction vessel between the substrate and the light-transmitting window; and a reaction gas supply nozzle disposed in the substrate holder opposite a second surface of the substrate and connected to the gas supply port.

According to another aspect of the present invention, there is provided a semiconductor production apparatus comprising a reaction vessel for accommodating a substrate and including a gas supply port, a gas discharge port, and a light-transmitting glass window; a light-irradiating means disposed outside the reaction vessel for irradiating a substrate inside the reaction vessel through the light-transmitting glass window with light to heat the substrate; an "O" ring sealing the glass window and the reaction vessel; and a reflective metallic film disposed on the portion of the glass window contacting the "O" ring.

According to still another aspect of the present invention, there is provided a semiconductor film production apparatus for producing a semiconductor film on a substrate comprising a reaction vessel for accommodating a substrate and a susceptor for supporting the substrate; reaction gas supply means for supplying a reaction gas; and a heater for heating the substrate wherein the reaction gas supply means includes a plurality of reaction gas supply nozzles, each gas supply nozzle having at least one reaction gas nozzle port separated by a respective distance from the substrate, the distances between the respective reaction gas nozzle ports and the substrate and the rates of supply of the reaction gas from the respective reaction gas supply nozzles being controlled for each reaction gas supply nozzle independent of other reaction gas supply nozzles.

DETAILED DESCRIPTION OF THE PREFERRED EMBODIMENTS

Preferred embodiments of the present invention will be described with reference to the accompanying drawings. Throughout the drawings, the same reference numerals are used to denote the same parts or components.

FIRST EMBODIMENT

Figure 1:
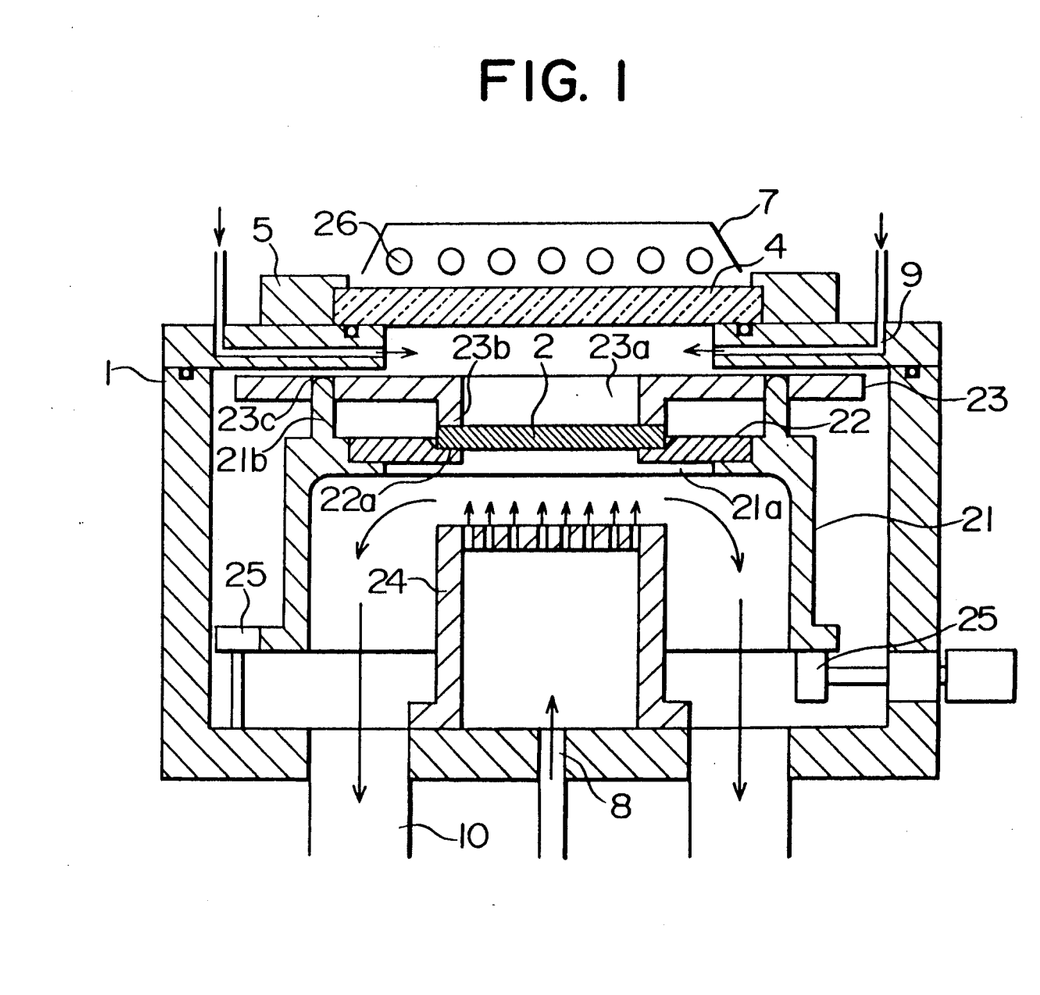
FIG. 1 is a schematic sectional view of a first embodiment of a semiconductor film production apparatus in accordance with the present invention.

A complete apparatus according to the invention is shown in a cross-sectional view in FIG. 1. A cylindrical substrate holder 21, shown in an exploded perspective view in FIG. 2, has an upper opening 21a having a diameter larger than the diameter of a substrate 2 and a pin 21b which functions as a retainer. The substrate holder 21 is disposed in a reaction vessel 1 such that the opening 21a faces the light-transmitting glass window 4. The light-transmitting glass window 4 has an effective field diameter larger than the outside diameter of the substrate 2. In this embodiment, a plurality of supporting bars 22, which are provided with steps for contacting the outside diameter of the substrate 2, are mounted on the substrate holder 21 at the upper inner edge of the opening 21a such that the substrate 2 is supported by the supporting bars 22 with movement of its outside edge of the substrate limited by the steps 22a.

Figure 2:
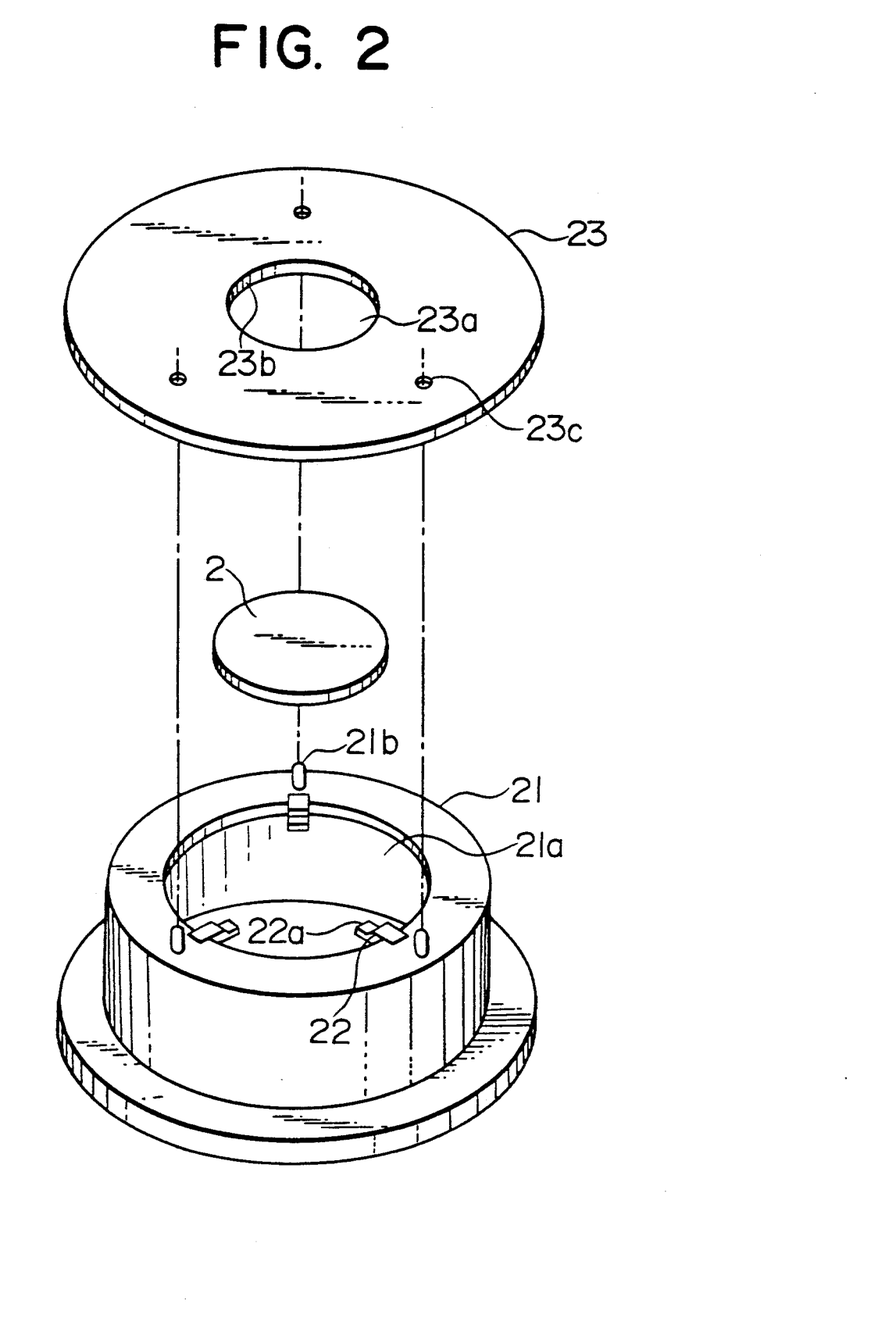
FIG. 2 is an exploded perspective view of a portion of the semiconductor film production apparatus of FIG. 1.

A ring plate 23 has a central opening 23a with an outside diameter smaller than the diameter of the substrate 2, a projection 23b of constant height disposed on a lower inner edge, and a through-bore 23c as a retainer. The ring plate 23 divides the space inside the reaction vessel 1 into two compartments. The ring plate 23 is positioned so that through-bore 23c receives the pin 21b of the substrate holder 21 while the projections 23b cooperate with the steps 22a of the supporting bars 22 in holding the substrate 2 by making contact with the edge of the substrate 2. A reaction gas supply nozzle 24 has one end connected to a reaction gas supply port 8 while the other end is disposed in a lower portion of the reaction vessel 1 opposite the surface of the substrate 2. A rotary drive guide 25 supports a lower portion of the substrate holder 21 for rotation of the substrate holder 21 by an external driving means which is not shown. A plurality of linear halogen lamps 26, forming a light source, are arranged side-by-side around the substrate 2 opposite the light-transmitting glass window 4. A carrier gas supply port 9 is provided in an upper portion of the reaction vessel 1 for introducing a carrier gas into a space between the substrate 2 and the light-transmitting glass window 4. Gas discharge ports 10 are disposed in a lower portion of the reaction vessel 1 surrounding the reaction gas supply nozzle 24.

The substrate 2 is placed on three supporting bars 22 secured to the substrate holder 21 such that the substrate surface to be treated is directed downward. The substrate 2 is positioned by the steps 22a of the three supporting bars 22, i.e., its edge is restricted in movement by the steps 22a. Subsequently, the ring plate 23 is placed on the substrate 2 such that the through-bore 23c is aligned with the pin 21b. As a result of the engagement between the pin 21b and the through-bore 23c, the ring plate 23 is prevented from lateral movement and the end of the projection 23b contacts the outer peripheral surface of the substrate 2, whereby the substrate 2 is clamped between the steps 22a of the supporting bars 22 and the projection 23b of the ring plate 23.

The rotary driving guide 25 is driven to rotate the substrate holder 21, the substrate 2, and the ring plate 23 stably. Light from the halogen lamps 26 reaches the substrate 2 through the light-transmitting glass window 4 and heats the substrate 2. A reaction gas mixture, e.g., a mixture containing silane, is introduced from the reaction gas supply nozzle 24 toward the surface of the substrate 2 to be treated. At the same time, a carrier gas is introduced through the carrier gas supply port 9 into the space between the substrate 2 and the light-transmitting glass window 4. As in the known semiconductor apparatus described before, the reaction gas forms, for example, a polycrystalline silicon film on the surface of the substrate 2. Most of the reaction gas then flows along the inner surface of the substrate holder 21 and is discharged from the gas discharge port 10.

In the first embodiment, the ring plate 23 divides the space inside the reaction vessel 1 into two compartments, namely, a compartment adjacent to the substrate 2 and a compartment adjacent to the light-transmitting glass window 4. In addition, the carrier gas is supplied to flow through the space between the upper surface of the substrate 2 and the light-transmitting glass window 4. Any portion of the reaction gas which is scattered through the opening 21a in the substrate holder 21 is prevented from reaching the light-transmitting glass window 4, flows along the inner surface of the reaction vessel 1, and is discharged from the gas discharge port 10.

The ring plate 23 is retained on the substrate holder 21 through mutual engagement of the pin 21 and the through-bore 23c. The rotary drive guide 25 rotates the substrate holder 21, stably rotating the substrate 2 and the ring plate 23. This rotation makes the temperature distribution and the reaction gas supply uniform over the entire surface of the substrate 2, thus improving the thickness uniformity and quality of the film formed on the substrate 2.

The projection 23b, the end surface of which contacts the outer peripheral surface of the substrate 2, is present on the entire inner edge of the ring plate 23. Therefore, the end surface of the projection 23b is never exposed to the reaction gas despite any offset of the substrate 2 on the supporting bars 22 from the correct position as a result of repeated semiconductor film production processing. Thus, the end surface of the projection 23b is always kept clean and free of reaction products. As a consequence, close contact between the substrate 2 and the end surface of the projection 23b is ensured despite repeated semiconductor film production cycles. Thus, changes in the heat transfer from the substrate to the environment are avoided, improving the reliability of film formation on the substrate 2. The close contact between the substrate 2 and the projection 23b also prevents any of the reaction gas or the carrier gas from leaking into the space adjacent the light-transmitting glass window 4 or the space adjacent the substrate 2 so that the rates of supply of the reaction gas and the carrier gas are easily controlled.

The linear halogen lamps 26 are arranged side-by-side opposite an area including the area surrounding the substrate 2. The light from the light source, therefore, raises the temperature in the area around the substrate 2, preventing heat dissipation from the substrate 2 in the radial direction, thus contributing to the uniformity of the temperature distribution across the substrate.

SECOND EMBODIMENT

In the first embodiment as described, the linear halogen lamps 26 are arranged side-by-side opposite an area including an area surrounding the substrate 2. All of these lamps are supplied with electrical power at the same rate to heat not only the substrate 2 but also the area around the substrate 2 to suppress radial heat dissipation from the substrate 2, thereby making the substrate temperature uniform. By contrast, in the second embodiment of the present invention, the amount of the electrical power supplied to the lamps is varied so that the lamps 26 on both sides of the lamp array receive more electrical power than the central lamps 26. Thus, the peripheral region of the substrate 2 and the area around the substrate 2 are irradiated with at least as much energy as the central region of the substrate. As a consequence, dissipation of heat from the substrate 2 in the radial direction is suppressed so that uniformity of the temperature distribution over the entire area of the substrate surface is improved.

THIRD EMBODIMENT

Figure 3:
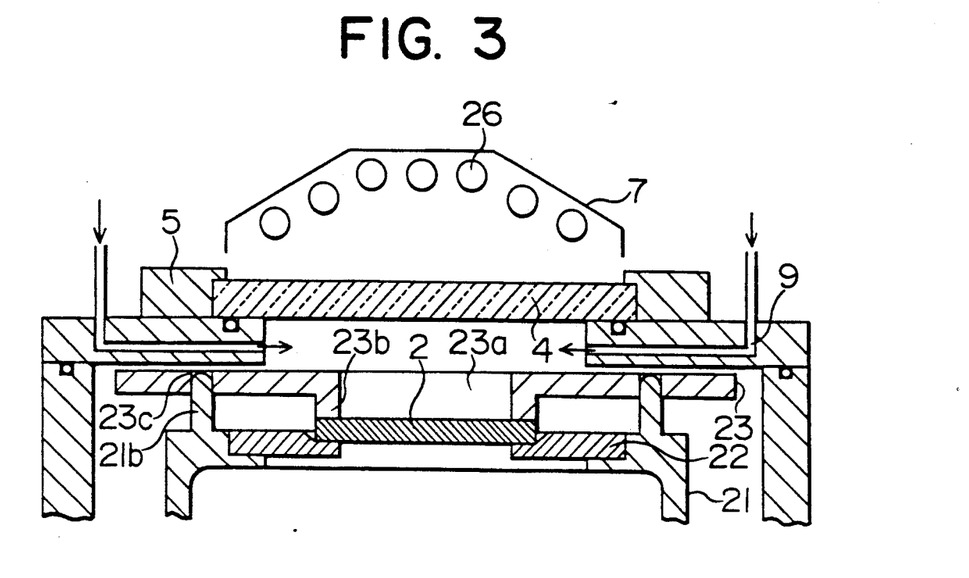
FIG. 3 is a schematic sectional view of a portion of a third embodiment of a semiconductor film production apparatus in accordance with the present invention.

FIG. 3 shows a third embodiment of the present invention in which a plurality of linear halogen lamps 26 are disposed opposite not only to the substrate but also an area around the substrate 2. The outer halogen lamps 26 are disposed closer to the substrate 2 than are the central halogen lamps 26. According to this arrangement, the peripheral region of the substrate 2 and the area around the substrate 2 are irradiated with at least as much energy as the central region of the substrate even when all the halogen lamps 26 are supplied with the same electrical power. As a consequence, dissipation of heat from the substrate 2 in the radial direction is suppressed so that the uniformity of the temperature distribution over the entire area of the substrate surface is improved.

FOURTH EMBODIMENT

Figure 4:
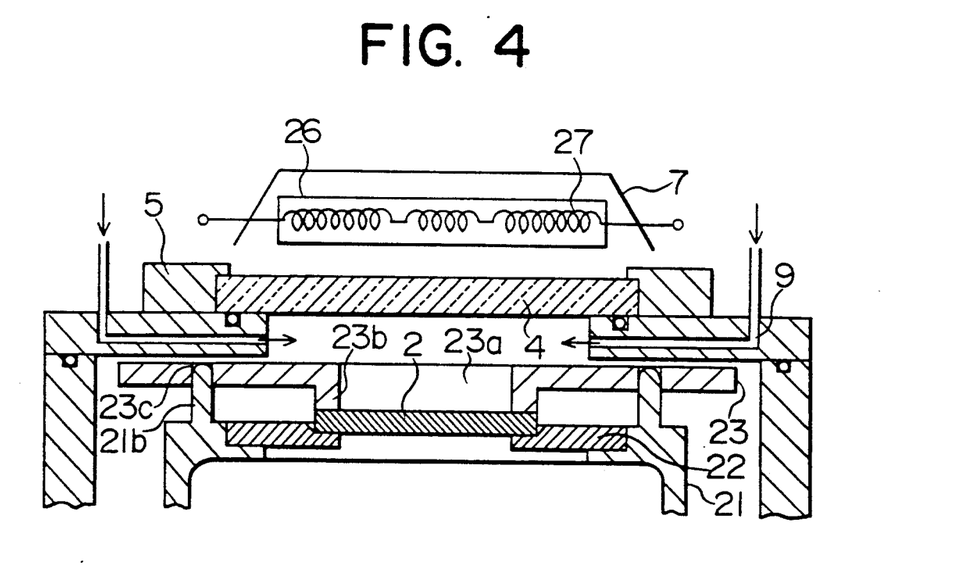
FIG. 4 is a schematic sectional view of a portion of a fourth embodiment of a semiconductor film production apparatus in accordance with the present invention.

FIG. 4 shows a fourth embodiment of the present invention in which a plurality of linear halogen lamps 26 are disposed opposite not only the substrate but also opposite the area around the substrate 2. The coiled filaments 217 of the outer halogen lamps 26 have a greater pitch than the filaments 217 of the central halogen lamps. According to this arrangement, the peripheral region of the surface of the substrate 2 and the area around the substrate 2 are irradiated with at least as much energy as the central region of the substrate. As a consequence, dissipation of heat from the substrate 2 in the radial direction is suppressed so that the uniformity of the temperature distribution over the entire area of the substrate surface is improved.

FIFTH EMBODIMENT

Figure 5:
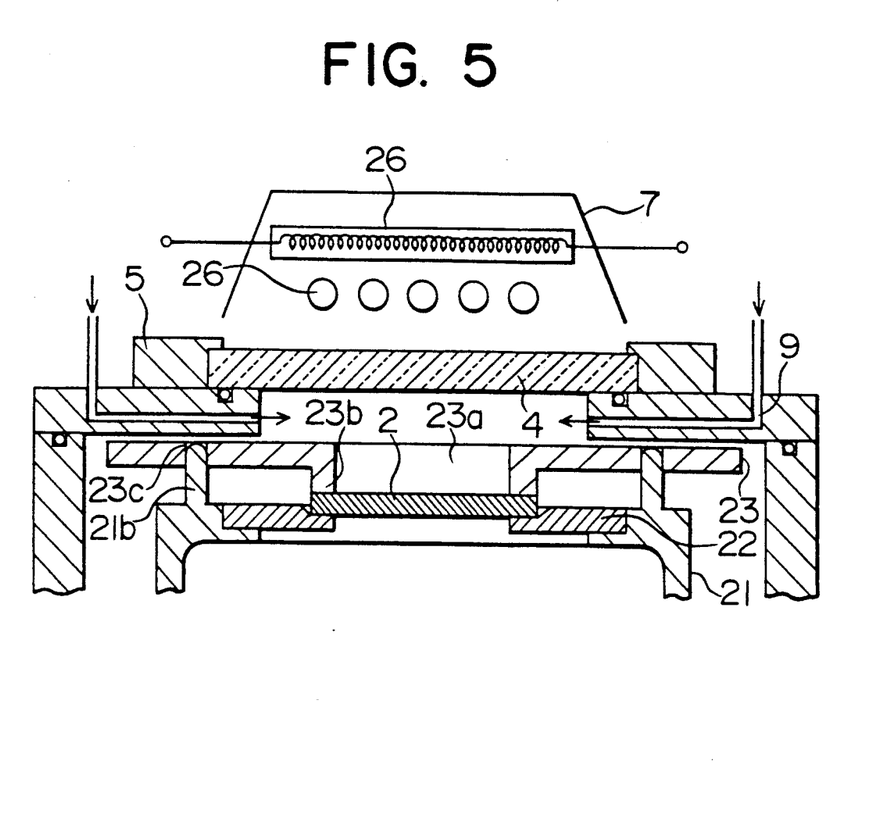
FIG. 5 is a schematic sectional view of a portion of a fifth embodiment of a semiconductor film production apparatus in accordance with the present invention.
Figure 6:
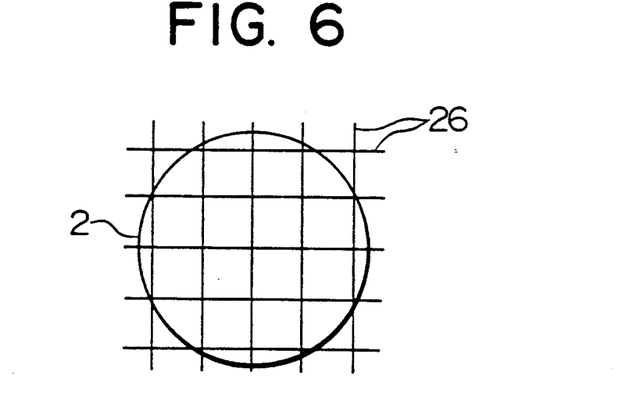
FIG. 6 is a plan view of a portion of the fifth embodiment showing particularly a substrate and a halogen lamp.

FIGS. 5 and 6 show a fifth embodiment which employs two arrays of halogen lamps 6 in two orthogonal stages opposite not only the substrate but also opposite the area around the substrate 2. According to this arrangement, a so-called planar light source is realized, improving the uniformity of both the rate at which energy is supplied and the temperature distribution over the entire area of the substrate.

SIXTH EMBODIMENT

Figure 7:
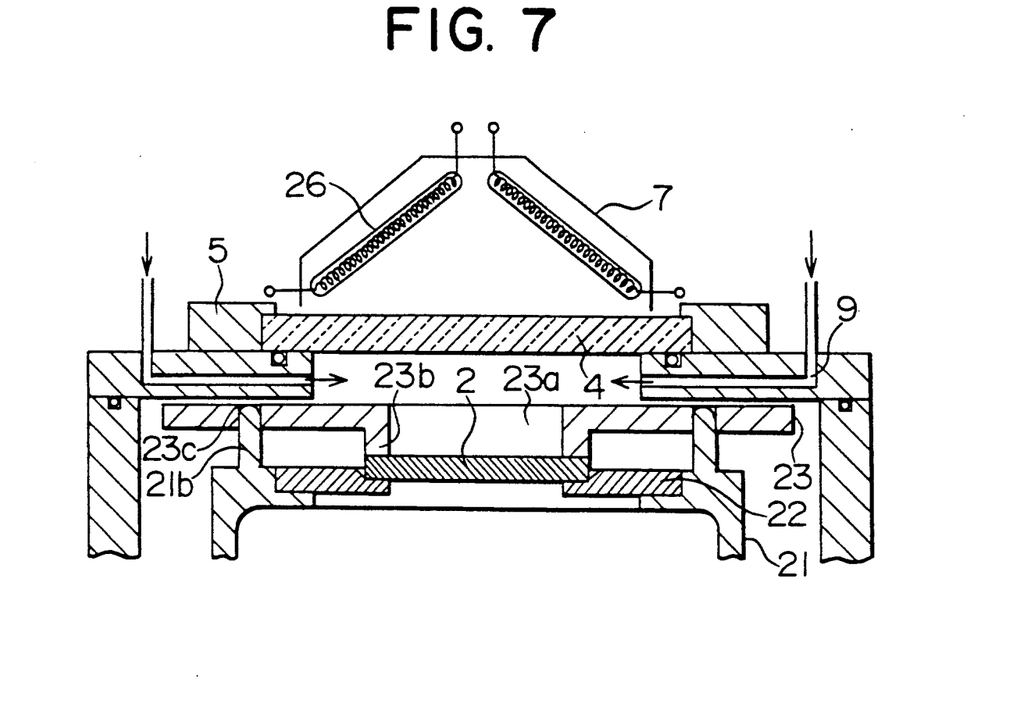
FIG. 7 is a schematic sectional view of a portion of a sixth embodiment of a semiconductor film production apparatus in accordance with the present invention.
Figure 8:
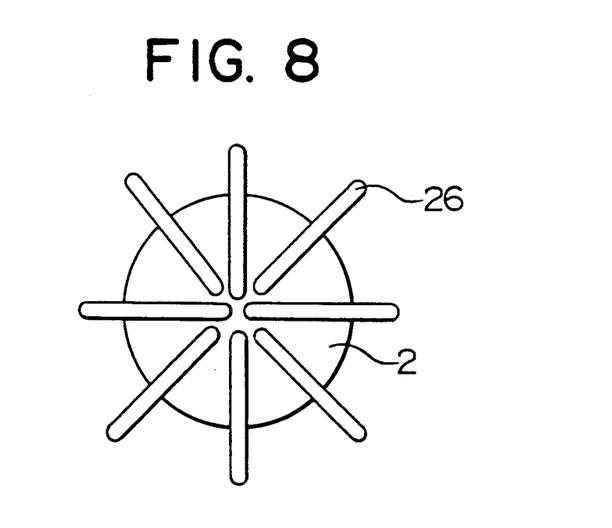
FIG. 8 is a plan view of a portion of the sixth embodiment, particularly showing a substrate and a halogen lamp.

FIGS. 7 and 8 show a sixth embodiment in which a plurality of linear halogen lamps are arranged opposite not only the substrate but also the area around the substrate 2 such that the distance between the halogen lamps 26 and the substrate 2 is smaller at the radially outer ends of the halogen lamps 26 than at the inner central ends of the lamps 26. As a consequence, dissipation of heat from the substrate 2 in the radial direction is suppressed so that the uniformity of the temperature distribution over the entire area of the substrate surface is improved.

SEVENTH EMBODIMENT

Figure 9:
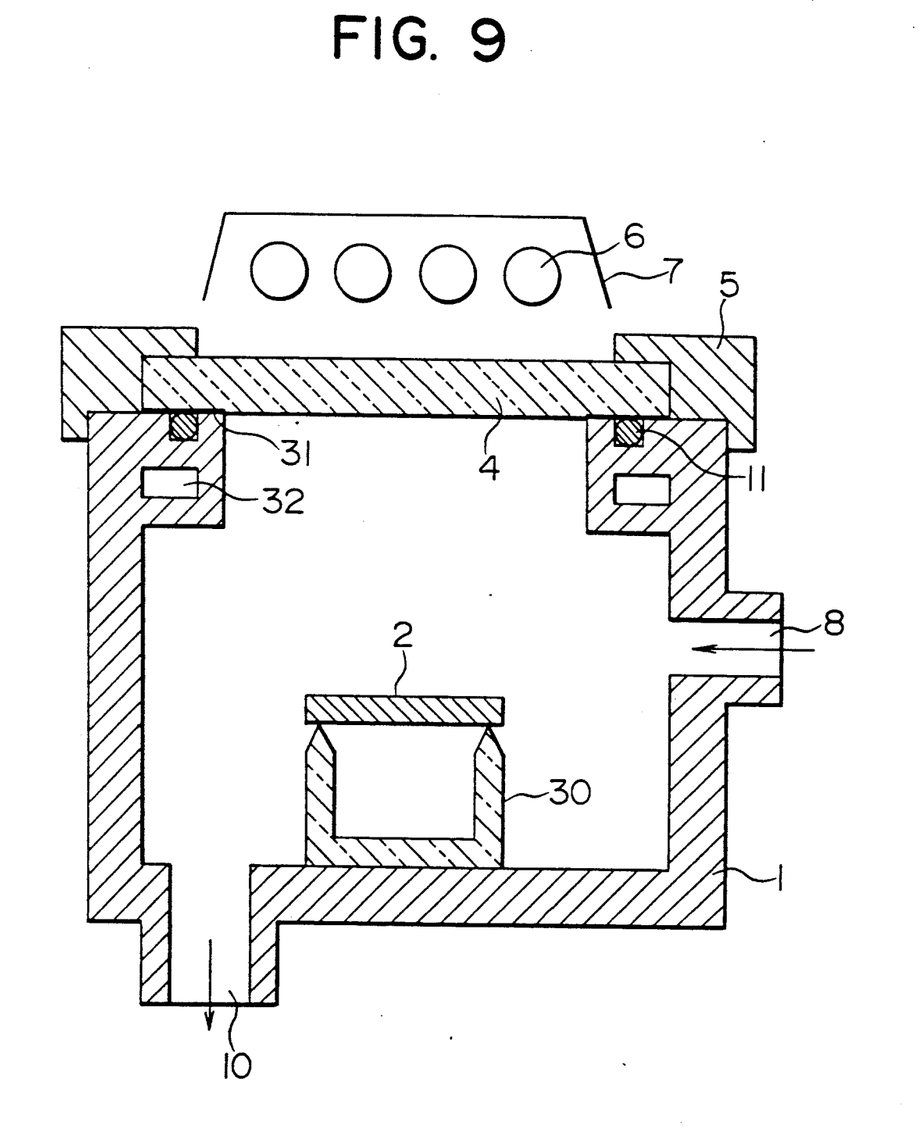
FIG. 9 is a schematic sectional view of a portion of a seventh embodiment of a semiconductor film production apparatus in accordance with the present invention.

FIG. 9 shows a schematic sectional view of a seventh embodiment of a semiconductor production apparatus according to the present invention. Referring to this figure, a substrate 2 is supported by glass pins 30. A reflective metal film 31 is disposed on a light-transmitting glass window 4. A cooling water conduit 32 is disposed in a portion of the wall of the reaction vessel 1 beneath a groove for retaining an "O" ring 11.

The operation of this embodiment, for the purpose of forming a thin silicon film, for example, is the same as those described before. A portion of the infrared light from the infrared lamp 6 impinging upon the light-transmitting glass window 4 is reflected by the metallic film 31 on the glass window 4 so that adsorption of light by the "O" ring is suppressed and the temperature of the "O" ring does not rise beyond the predetermined rated temperature.

The infrared light reflected by the metallic film 31 are partly absorbed by the cover plate 5. The cover plate 5 is a metallic material having a high heat conductivity and dissipates heat to the ambient or to the wall of the reaction vessel 1 which is cooled by the cooling water circulated through the cooling water conduit 32 whereby a temperature increase in the cover plate 5 is avoided.

EIGHTH EMBODIMENT

Figure 10:
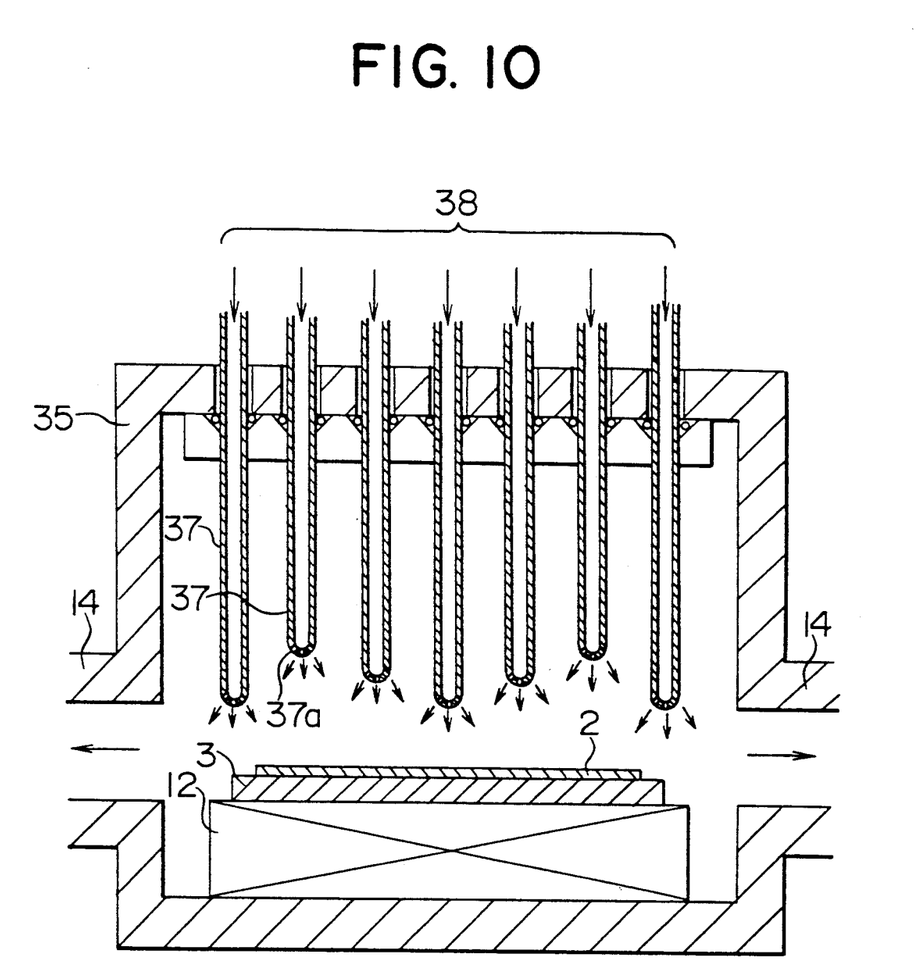
FIG. 10 is a schematic sectional view of an eighth embodiment of a semiconductor film production apparatus in accordance with the present invention.
Figure 11:
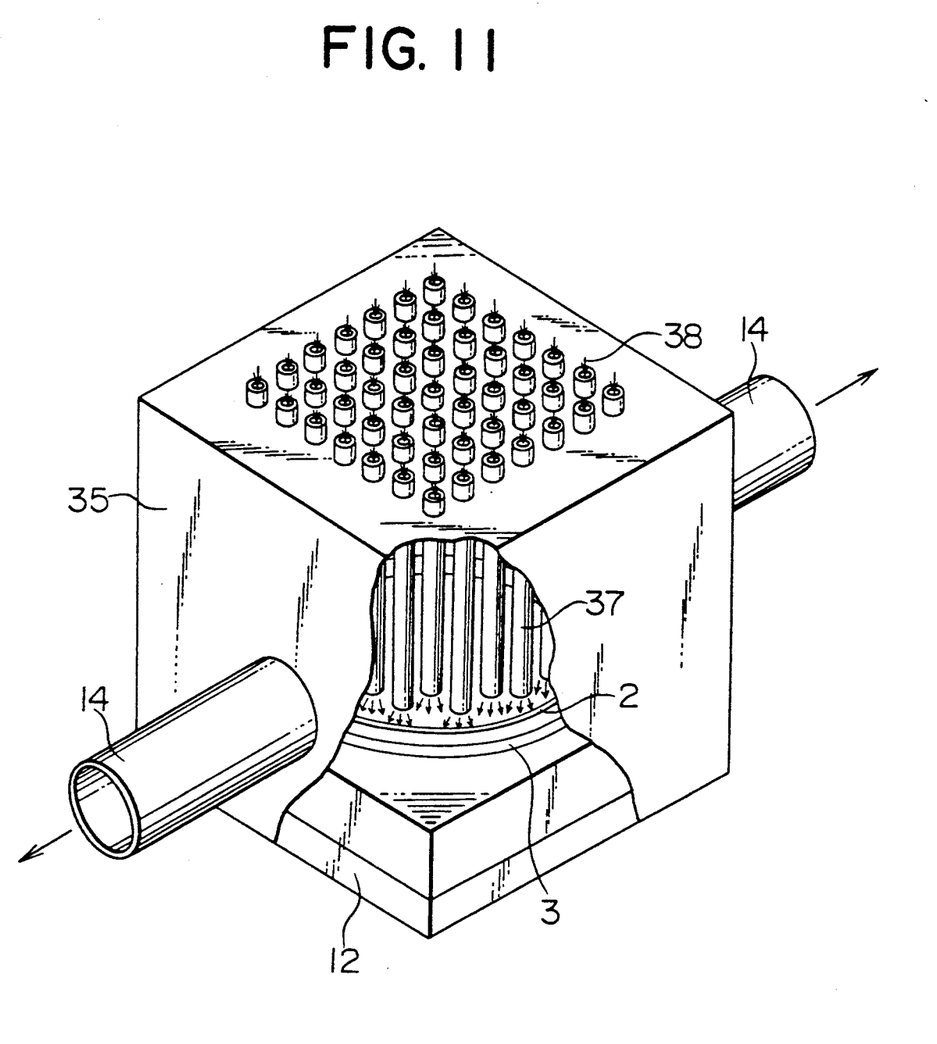
FIG. 11 is a perspective view of the apparatus shown in FIG. 10.

FIGS. 10 and 11 illustrate an eighth embodiment of a semiconductor production apparatus according to present invention. In this embodiment, the substrate 2 is supported by a susceptor 3 disposed within a reaction chamber 35 defined by walls made of a heat- and corrosion-resistant metal and is heated to a desired temperature, e.g., 200° to 300° C., by means of a heater 12. A reaction gas 38 is supplied to the substrate 2 through at least two of the reaction gas supply nozzles 37, each of which has at least one reaction gas nozzle port 37a for ejection of a reaction gas 38. The rates of supply of the reaction gas to the respective reaction gas supply nozzles 37 are independently controlled by means of a mass-flow controller which is not shown.

The distances between each of the reaction gas nozzle ports 37a of the respective reaction gas supply nozzles 37 and the substrate 2 are independently controlled. By independently controlling the rates of supply of the reaction gas and the distances between the reaction gas nozzle ports and the substrate 2 for each of the ports, it is possible to control the concentrations of the reaction gases 38 reaching the substrate 2 and improve the uniformity of the thickness of the film formed on the substrate 2. The features of the semiconductor production apparatus according to the eighth embodiment can also be applied to other thin-film forming apparatus.

What is claimed is:

1. A semiconductor film production apparatus comprising:
    a reaction vessel for containing a substrate and including a gas supply port for supplying a reaction gas to said reaction vessel, a gas discharge port for discharging the reaction gas from said reaction vessel after a reaction, and a light-transmitting glass window;
    light irradiating means disposed outside said reaction vessel for irradiating a substrate in said reaction vessel through said light-transmitting glass window to heat the substrate;
    a cylindrical substrate holder disposed in said reaction vessel for holding the substrate with a first surface facing said light irradiation means and a second surface, opposed to the first surface, exposed to the reaction gas;
    a ring plate having a central opening with an area smaller than the substrate and an outside diameter dividing said reaction vessel into two compartments, said ring plate contacting the first surface of the substrate;
    a carrier gas supply port for introducing a carrier gas between the substrate and said light-transmitting glass window; and
    a reaction gas supply nozzle disposed in said substrate holder connected to said gas supply port and opposing the second surface of the substrate.

2. A semiconductor film production apparatus according to claim 1 wherein said cylindrical substrate holder has a retaining portion and said ring plate has a retained portion complementary with said retaining portion, said apparatus comprising a rotary drive guide on said cylindrical substrate holder for rotating the substrate.

3. A semiconductor film production apparatus according to claim 1 wherein said ring plate includes a projection for contacting a peripheral region of said substrate.

4. A semiconductor film production apparatus according to claim 1 wherein said light-transmitting glass window has an effective field diameter larger in area than the substrate and said light irradiation means includes a plurality of linear halogen lamps opposing the substrate and an area adjacent said substrate.

5. A semiconductor film production apparatus according to claim 1 wherein said light irradiation means includes a plurality of linear halogen lamps containing coiled filaments and opposing the substrate, the filaments of outer halogen lamps having greater pitches than the filaments of central halogen lamps.

6. A semiconductor film production apparatus according to claim 1 wherein said light irradiation means includes a first array of a plurality of linear halogen lamps opposite the substrate and a second array of linear halogen lamps spaced from said first array and orthogonal thereto.

7. A semiconductor film production apparatus according to claim 1 wherein said light irradiation means includes a plurality of linear halogen lamps disposed radially opposite the substrate.

* * * * *